Jan. 1, 1974 L. V. GREGOR ET AL 3,783,119

METHOD FOR PASSIVATING SEMICONDUCTOR MATERIAL AND FIELD EFFECT TRANSISTOR FORMED THEREBY

Filed June 18, 1969

INVENTORS
LAWRENCE V. GREGOR
LEON I. MAISSEL
BY Frank C. Leach Jr.
ATTORNEY

United States Patent Office 3,783,119
Patented Jan. 1, 1974

3,783,119

METHOD FOR PASSIVATING SEMICONDUCTOR MATERIAL AND FIELD EFFECT TRANSISTOR FORMED THEREBY

Lawrence V. Gregor, Hopewell Junction, and Leon I. Maissel, Poughkeepsie, N.Y., assignors to International Business Machines Corporation, Armonk, N.Y.

Filed June 18, 1969, Ser. No. 834,412
Int. Cl. C23c 15/00
U.S. Cl. 204—192 9 Claims

ABSTRACT OF THE DISCLOSURE

A gettering layer of phosphorus pentoxide ($P_2O$ ) or lead oxide (PbO) is deposited on a thermally grown or pyrolytically deposited layer of silicon dioxide to form a glass to getter the sodium ions from the silicon dioxide layer. The gettering agent is then removed by sputter etching and a protective material such as silicon nitride, for example, is then deposited on the silicon dioxide by sputtering in a manner to avoid any contamination of the silicon dioxide after the gettering agent has been removed.

In forming insulated gate field effect transitors on a semiconductor substrate, the surface of the substrate is covered with an oxide layer that functions as an insulating material after diffusion of an impurity into the semiconductor substrate to form the source and drain electrodes has been completed. The oxide layer on the substrate is normally silicon dioxide, and this layer of silicon dioxide is preferably formed on the surface of the substrate by thermal oxidation although it also may be formed by pyrolytic deposition, for example.

During the thermal growth of the silicon dioxide, sodium ions are introduced into the silicon dioxide by furnace impurities or other sources of contamination. The sodium ions can produce an inversion layer on the surface of the substrate by forming a space charge in the layer of silicon dioxide.

As a result of the presence of an inversion layer at the surface of the substrate in which the field effect transistor is formed, applying a voltage to the gate electrode will not accurately control the current flow between the source and the drain electrodes of a field effect transistor. Thus, for satisfactory operation of a field effect transistor, it is mandatory that there be no inversion layer altering the conductive path between the source and drain electrodes of a field effect transistor.

In bipolar transistors, this problem of the presence of sodium ions in the layer of silicon dioxide has been eliminated by the utilization of a layer of a gettering agent such as phosphorus pentoxide, for example, to collect the sodium ions as shown and described in U.S. Pat. 3,343,-049 to William H. Miller et al. Thus, an inversion layer along the surface of the substrate of a bipolar transistor is eliminated by utilization of a layer of phosphorus pentoxide on top of the silicon dioxide layer.

While the use of phosphorus pentoxide as a gettering agent in which the phosphorus pentoxide layer remains on the silicon dioxide layer satisfactorily eliminates the inversion layer problem in a bipolar transistor, this layer of phosphorus pentoxide cannot be satisfactorily used in field effect transistors by being allowed to remain thereon. When the layer of phosphorus pentoxide remains on the silicon dioxide layer in field effect transistor, a number of problems exist.

First, even though sodium ions would be collected in the layer of phosphorus pentoxide, the electrical polarizability of phosphorus pentoxide with silicon dioxide creates a type of inversion layer on the surface of the substrate. Thus, even though the sodium ions may have been removed from the silicon dioxide layer into the layer of phosphorus pentoxide, there will still be an inversion layer on the surface of the substrate between the source and drain electrodes of a field effect transistor because of the polarizability of phosphorus pentoxide with silicon dioxide.

Since a bipolar transistor has a doping level of three orders of magnitude greater than the doping level of a field effect transistor, the surface of the bipolar transistor is only about $\frac{1}{32}$ as sensitive to electrical polarization as the surface of the field effect transistor. Thus, any inversion layer created on the surface of the substrate by allowing the phosphorus pentoxide to remain on the silicon dioxide layer on the bipolar transistor is not sufficient to affect the operating characteristics of the bipolar transistor.

Additionally, if the phosphorus in the layer of phosphorus pentoxide should penetrate the silicon dioxide, the phosphorus could pass through the layer of silicon dioxide and change the dopant of the P-type silicon substrate. A sufficient change in this dopant would result in an electrical path between the two N+ areas whereby the gate electrode could not accurately control the field effect transistor.

Another objection to leaving the layer of phosphorus pentoxide on the silicon dioxide in a field effect transistor is that phosphorus pentoxide is chemically reactive with water and may eventually cease to protect the silicon dioxide. As a result, the layer of phosphorus pentoxide may react with the water sufficiently to no longer provide protection to the silicon dioxide whereby the silicon dioxide would collect sodium ions from the atmosphere.

In adidtion to being chemically reactive with water, phosphorus pentoxide also dissolves in various cleaning solutions, which are utilized to remove the residue of the photoresist material. Thus, the layer of phosphorus pentoxide may accidentally be removed in various areas during removal of the photoresist residue whereby the silicon dioxide layer may again become contaminated with sodium ions and produce an inversion layer.

In bipolar transistors, the layer of phosphorus pentoxide can be much thicker than in field effect transistors. It is necessary that the total thickness of silicon dioxide and phosphorus pentoxide between the gate electrode and the substrate of the field effect transistor be no more than 1000 A. for the gate electrode to produce the desired control whereas the combined layer of phosphorus pentoxide and silicon dioxide in a bipolar transistor may be 4500 A., for example. Thus, the layer of phosphorus pentoxide on the bipolar transistor will not be removed, by water or cleaning solutions for photoresist residue, to such an extent that the layer of silicon dioxide is not protected.

To produce the gate electrode of the field effect transistor, it is necessary to create a metallic area adjacent the thin layer of silicon dioxide and phosphorus pentoxide. When aluminum is utilized as the metal, the reaction between aluminum and phosphorus pentoxide occurs more readily than between aluminum and silicon dioxide. As a result, a wavy interface due to the aluminum tending to penetrate the silicon dioxide is produced. This results in a quicker breakdown of the field effect transistor.

An object of this invention is to provide a method for passivating a semiconductor material.

Another object of this invention is to provide a method to stabilize operating characteristics of a field effect transistor.

A further object of this invention is to provide a field effect transistor having stabilized operating characteristics.

Still another object of this invention is to provide a method to remove sodium ions from a silicon dioxide layer that is used as an insulating layer on a field effect transistor.

The foregoing and other objects, features, and advantages of the invention will be more apparent from the following more particular description of the preferred embodiments of the invention as illustrated in the accompanying drawing.

Figure 2:
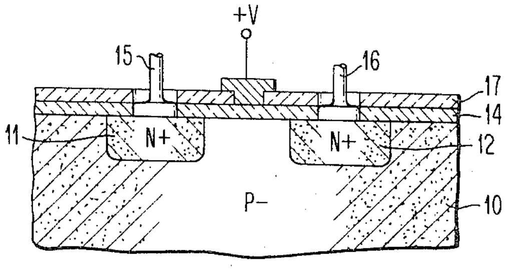
FIG. 2 is a sectional view of a field effect transistor produced by the method of the present invention.

Referring to the drawing and particularly FIG. 2, there is shown a substrate 10 of a semiconductor material such as silicon of P-type conductivity. A pair of N+ areas 11 and 12 is formed in the surface of the substrate 10 by diffusion in the well-known manner through openings in a layer (not shown) of silicon dioxide, for example. The areas 11 and 12 function as the source and drain electrodes of a field effect transistor.

The layer of silicon dioxide may be formed on the substrate surface having the areas 11 and 12 diffused therein by thermally growing the silicon dioxide, for example, or pyrolytically depositing the silicon dioxide on the substrate 10. Both of these techniques are well known.

It should be understood that the N+ areas 11 and 12 are formed by diffusing through openings, which are formed in the layer of silicon dioxide previously formed on the substrate 10. This layer of silicon dioxide is removed before a layer 14 of silicon dioxide is formed on the surface of the substrate 10. Openings are formed in the silicon dioxide layer 14 for contacts 15 and 16 to the N+ areas 11 and 12.

When the silicon dioxide layer 14 is formed on the substrate 10 by either being thermally grown thereon or pyrolytically deposited thereon, contaminants are present in the furnace or other apparatus used to form the silicon dioxide layer 14. These contaminants include sodium ions, which are very mobile in an amorphous silicate material such as silicon dioxide. Thus, the sodium ions will affect the operating characteristics of the field effect transistor by producing an electrical connection between the N+ areas 11 and 12.

This electrical connection between the N+ areas 11 and 12 is due to an inversion layer on the upper surface of the substrate 10. This is formed due to the sodium ions in the layer 14 of silicon dioxide attracting electrons in the area of the P-type substrate 10 between the N+ areas 11 and 12 to the surface of the substrate.

Figure 1:
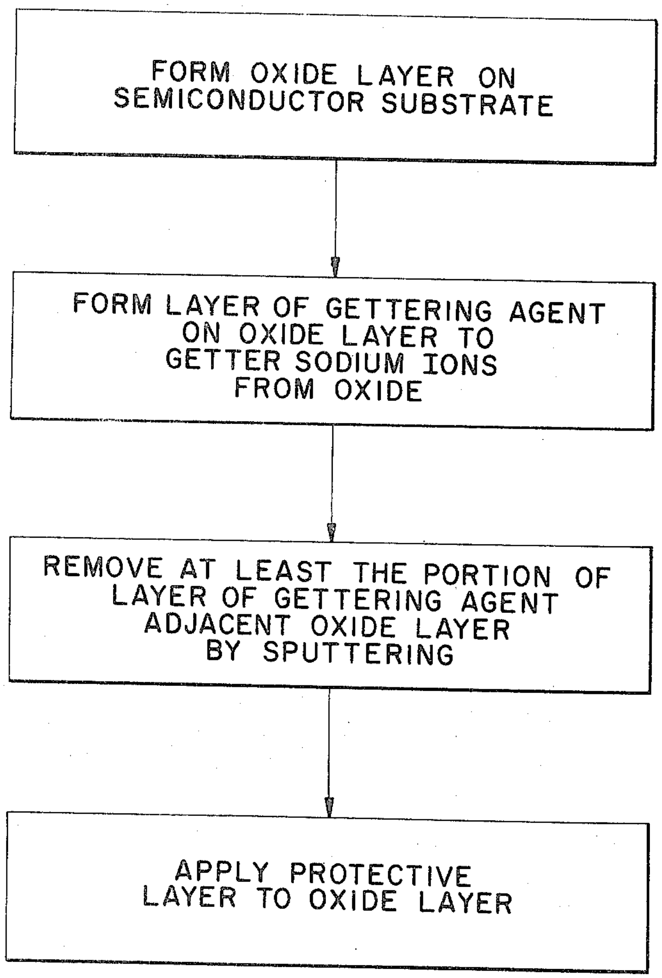
FIG. 1 is a chart indicating the principal steps of carrying out the method of the present invention.

Accordingly, as shown in FIG. 1, a layer of a gettering agent such as phosphorus pentoxide, for example, is diffused into the layer 14 of the silicon dioxide through its upper surface. This layer of phosphorus pentoxide getters the sodium ions in the layer 14 of silicon dioxide by attracting the sodium ions into the phosphorus pentoxide. As a result, the sodium ions, which can produce an inversion layer to electrically connect the N+ areas 11 and 12 to each other, are removed from the silicon dioxide layer 14.

The layer of phosphorus pentoxide is diffused into the layer 14 of silicon dioxide after the silicon dioxide has been formed on the substrate 10. Any suitable source of a phosphorus pentoxide vapor may be used to deposit the phosphorus pentoxide. For example, phosphine, phosphorus oxychloride, or a phosphorus pentoxide powder may be employed.

During the formation of the layer of phosphorus pentoxide on the silicon dioxide layer 14, the phosphorus pentoxide vapor is believed to penetrate into the layer 14 of silicon dioxide and change the composition of the upper portion of the layer 14. However, the vapor does not pass through the layer 14 into the substrate 10.

Because of the reaction between the phosphorus pentoxide and the silicon dioxide, the resultant layer is $P_2O_5 \cdot SiO_2$. This is commonly known in the semiconductor art as phospho-silicate glass.

After the gettering agent has been diffused into the layer 14 of silicon dioxide, the layer of phospho-silicate glass is removed. This removal includes a slight portion of the layer 14 of silicon dioxide beyond that which has been penetrated by the phosphorus pentoxide vapor during formation of the layer of phosphorus pentoxide.

To avoid any contamination of the remainder of the layer 14 of silicon dioxide by sodium ions, it is necessary to remove at least the last 200 A. of the phospho-silicate glass by sputtering. One suitable means of sputtering is to sputter etch the phospho-silicate glass in an RF sputtering apparatus of the type more particularly shown and described in U.S. Pat. 3,369,991 to Davidse et al.

While it is necessary that the last portion of the phospho-silicate glass layer be removed by sputtering to avoid any contamination thereof, it should be understood that the initial portions of the layer of the phospho-silicate glass may be removed by any suitable means. Although it is preferred that all of the phospho-silicate glass be removed by sputter etching, it is only necessary that the removal of the last portion of the phospho-silicate glass layer, which is adjacent to the layer 14 of silicon dioxide, be in a contamination-free manner to avoid any contamination of the silicon dioxide layer 14 by sodium ions.

In sputter etching the phospho-silicate glass, it is necessary to prevent any of the phospho-silicate glass from returning to the material from which it is being sputter etched. Otherwise, the sodium ions, which are trapped in the phospho-silicate glass, will return to the layer 14 of silicon dioxide so that the oxide would not be free of the sodium ions. Accordingly, suitable means must be employed in the sputtering chamber to prevent this.

One suitable example for preventing any sputtering of the material, which is being sputter etched, from returning to the silicon dioxide layer 14, is an apparatus shown and described in the copending patent application Ser. No. 834,444 (IBM Docket FI9-68-071) of Lawrence V. Gregor et al., now U.S. Pat. No. 3,617,463, for "Improved Apparatus and Method for Sputter Etching," filed on the same date as the present application, and assigned to the same assignee as the assignee of the present application. Of course, any other suitable means such as a shutter, for example, may be employed.

After the layer of the gettering agent has been removed from the layer 14 of silicon dioxide, a protective material must be added to the surface of the silicon dioxide layer 14 to prevent any contamination of the layer 14 by sodium ions. This layer of protective material must be added in a contamination-free environment.

While any suitable means for adding the protective material in a contamination-free environment may be employed, a layer 17 of a protective material is preferably added by sputtering in the same sputtering chamber in which the layer of phospho-silicate glass was sputter etched. However, under clean laboratory conditions where a contamination-free environment may be provided, the protective material may be added in another sputtering chamber.

When sputtering of the protective material occurs in the same sputtering chamber in which sputter etching of the phospho-silicate glass occurred, it also is necessary to prevent any of the phospho-silicate glass, which has the sodium ions entrapped therein, from sputtering onto the target of the protective material. Therefore, the means, which is employed in the sputtering chamber to prevent any of the phospho-silicate glass from being sputtered onto the silicon dioxide layer 14, also prevents any of the phospho-silicate glass from sputtering onto the target, which is to supply the protective material.

As shown in FIG. 2, the layer 17 of the protective material is disposed on top of the layer 14 of silicon dioxide. By depositing this layer 17 wtihout any contamination of the silicon dioxide layer 14 with sodium ions, no inversion layer is produced in the silicon to affect the operating characteristics of the field effect transistor.

Samples were prepared in accordance wtih the method of the present invention and compared with other samples, which have not been prepared in accordance with the present invention. These comparison tests indicate the increased stability of the surface of a semiconductor substrate subjected to the method of the present invention.

Four samples were prepared with each of the samples being a silicon substrate having a <100> orientation. Each of the substrates was chemical-mechanical polished. Each of the four substrates had a silicon dioxide layer of 4500 A. formed thereon by oxidizing dry oxygen in a furnace at an oxidation temperature of 1050° C.

The two samples which were prepared in accordance with the method of the present invention, were then disposed in a furnace in which phospho-silicate glass ($P_2O_5 \cdot SiO_2$) was deposited by exposure to phosphorus oxychloride ($POCl_3$) vapor at 1000° C. in a furnace. A 1100 A. thick layer of the phospho-silicate glass was diffused into the silicon dioxide layer. The total thickness was still 4500 A.

The samples were then put in a vacuum system, which was pumped to $10^{-5}$ torr and formed a sputtering chamber, in which the apparatus of the aforesaid Gregor et al. application was employed. Argon was then admitted to the vacuum system with a pressure of up to $10^{-2}$ torr.

Reverse sputtering or sputter etching was then employed to remove the phospho-silicate glass at a rate of 60 A./min. The reverse sputtering occurred for twenty minutes at 100 watts to remove the 1100 A. layer of phospho-silicate glass plus 100 A. of the silicon dioxide layer to leave a silicon dioxide layer with a thickness of 3300 A. This insures that any phosphorus, which may have penetrated beyond the upper 1100 A. of the silicon dioxide layer that was converted into phospho-silicate glass, is removed.

This substrate was then removed to another vacuum system, which was clean so as not to have sodium ions or other contaminants therein. The environment, which was a laboratory, also was free of sodium ions. In this vacuum system, silicon nitride ($Si_3N_4$) was deposited at a rate of 200 A./min. for five minutes to produce a protective layer of 1000 A. of silicon nitride. The silicon nitride was deposited at 1000 watts.

In addition to the two samples subjected to the method of the present invention, one of the remaining two of the four samples merely had an oxide layer of 4500 A. thickness formed thereon. The fourth sample was formed with the oxide layer of 4500 A. thickness and then had silicon nitride with a thickness of 1000 A. deposited thereon. This fourth sample was not subjected to any other treatment.

All of these samples were then tested for stability at a temperature bias of 200° C. for one hour in a positive electrical field of $5 \times 10^5$ volts/cm. The flat band charge, which is a measure of surface stability of the silicon substrate before and after bias treatment, was measured for each of the four samples before and after the bias treat. ment.

With sample 1 indicating the sample having only 4500 A. thickness, sample 2 indicating the sample having 4500 A. thickness with a 1000 A. layer of silicon nitride thereon, and samples 3 and 4 indicating the two samples subjected to the method of the present invention, the following measurements were obtained.

| Sample | Before bias treatment | After bias treatment | Difference |
|---|---|---|---|
| 1 | 0.57 | 5.03 | 4.46 |
| 2 | 1.43 | 3.60 | 2.17 |
| 3 | 0.78 | 1.61 | 0.83 |
| 4 | 0.80 | 1.70 | 0.90 |

Each of these readings is in $10^{11}$ charges/cm.$^2$.

Since the instability of the substrate increases as the difference increases, it is noted that samples 3 and 4 produced a much more stable material. Thus, samples 3 and 4 were about five times as stable as sample 1 and over twice as stable as sample 2. Therefore, while the layer of silicon nitride reduces any further contamination of the silicon dioxide, it does not remove the sodium ions. However, these results show that contamination continues if there is no silicon nitride layer over the silicon dioxide layer as indicated by the difference in stability between samples 1 and 2.

While the foregoing methods is the preferred method for removing sodium ions from the silicon dioxide layer, it should be understood that the sodium ions may be removed by other methods to achieve a clean layer of silicon dioxide before it is passivated with the silicon nitride.

In one method, a thin metallic film such as aluminum, for example, could be applied to the upper surface of the silicon dioxide. Then, a positive bias having an electric field of $10^5$ volts/cm. could be applied for ten minutes to the metallic film with the substrate heated to the tempera- of 200° C. This would result in driving or attracting the sodium ions to the upper surface of the silicon dioxide layer. The substrate could then be disposed in a sputter-chamber to remove the metallic film and the upper portion of the silicon dioxide prior to the deposition of silicon nitride.

A further method combines the use of a layer of phospho-silicate glass with the metallic electrode to increase the efficacy of the process by combining the beneficial effects of the phospho-silicate glass and the positive electric field. Thus, instead of applying the thin metallic film to the upper surface of the silicon dioxide, the thin metallic film would be applied to a layer of phospho-silicate glass formed on the silicon dioxide layer 14 by the preferred method. It would be necessary to remove the film and the phospho-silicate glass prior to the deposition of the silicon nitride.

Another method of driving the sodium ions to the surface of the silicon dioxide layer is to dispose a filament above the upper surface of the silicon dioxide layer but as close thereto as possible within a vacuum area. With the filament heated sufficiently for it to emit electrons, application of a negative voltage between the filament and the bottom surface of the silicon dioxide causes electrons from the filament to bombard the upper surface of the silicon dioxide layer and cause the potential of the upper surface of the silicon dioxide to become substantially the same as the potential of the filament. This brings the sodium ions to the upper surface of the silicon dioxide layer.

Then, the upper portion of the silicon layer would be removed by reverse sputtering, for example, in the same manner as the phospho-silicate glass is reverse sputtered in the preferred method. The silicon nitride would then be deposited on the silicon dioxide.

In still another method of passivating semiconductor substrates, the substrate could be disposed within a sputtering chamber and cathodically sputtered by argon ions at low pressure. This results in the upper surface of the silicon dioxide layer being negatively charged with respect to the lower surface of the silicon dioxide layer whereby the sodium ions are driven to the upper surface of the silicon dioxide layer. During this time, the silicon dioxide layer is slowly sputtered away whereby sodium ions are removed therewith since the sodium ions are driven to the upper surface of the silicon dioxide layer by the natural field created during the RF sputtering.

The silicon dioxide, which remains, would be clean and not have sodium ions therein. It would then be necessary to deposit a thin layer of silicon nitride on the clean silicon dioxide to achieve complete passivation. This would prevent any contamination of the remaining silicon dioxide layer by sodium ions.

While the present invention has described the gettering agent as being phosphorous pentoxide, it should be understood that lead oxide (PbO) could be satisfactorily employed. It is only necessary that the gettering agent have the capability of attracting sodium ions and be diffusible into silicon dioxide or other amorphous silicate materials.

The method of the present invention is readily usable with any amorphous silicate material since sodium ions are very mobile in an amorphous silicate material. Therefore, any other oxide, which would have the desired insulating effects of silicon dioxide and be compatible with a semiconductor substrate, could be stabilized by the method of the present invention.

While the protective material has been described as a silicon nitride, it should be understood that any other suitable protective material could be employed if it was relatively inert chemically and formed a coherent layer so that no oxide could be formed. It also should not electrically affect the underlying semiconductor substrate. The protective material also should be capable of being fabricated by etching or shaping and of being deposited as a thin film. If possible, its thermal expansion coefficient should match the thermal expansion coefficient of the semi-conductor substrate. Aluminum oxide ($Al_2O_3$) and boron nitride (BN) are two other examples of a suitable protective material.

An advantage of this invention is that it increases the stability of field effect transistors by preventing an inversion layer from being formed in the substrate between the source and drain electrodes. Another advantage of this invention is that it eliminates the presence of sodium ions in silicon dioxide.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of stabilizing the surface of a semiconductor substrate having an amorphous silicate material thereon including:

forming a layer of the amorphous silicate material on the semiconductor substrate;

depositing the substrate within an RF sputtering chamber after the layer of amorphous silicate material has been formed on the substrate;

driving the sodium ions toward the upper surface of the layer of amorphous silicate material by the field produced in the upper portion of the layer of amorphous silicate material during the RF sputtering that removes the upper portion of the layer of amorphous silicate material having the sodium ions therein;

and applying a protective layer of material to the layer of amorphous silicate material without any contamination of the remainder of the layer of amorphous silicate material by sodium ions to protect the remainder of the layer of amorphous silicate material from sodium ions.

2. The method according to claim 1 in which the layer of amorphous silicate material is silicon dioxide.

3. The method according to claim 1 in which the protective layer is applied by sputtering.

4. The method according to claim 3 in which the protective layer is formed of a material selected from the group consisting of boron nitride, silicon nitride, and aluminum oxide.

5. The method according to claim 3 in which the protective layer is sputtered in the same chamber in which the gettering layer is removed by sputtering.

6. The method according to claim 1 in which the semiconductor substrate has a field effect transistor formed thereon.

7. A method of stabilizing the surface of a semiconductor substrate having an amorphous silicate material thereon including:

forming a layer of the amorphous silicate material on the semiconductor substrate;

depositing the substrate within an RF sputtering chamber after the layer of amorphous silicate material has been formed on the substrate;

RF sputter etching the upper surface of said amorphous silicate material;

and driving the sodium ions toward the upper surface of the layer of amorphous silicate material by the field produced in the upper portion of the layer of amorphous silicate material during the RF sputtering that removes the upper portion of the layer of amorphous silicate material having the sodium ions therein.

8. The method according to claim 7 in which a gettering layer is formed in the upper portion of the layer of amorphous silicate material prior to depositing the substrate within said sputtering chamber, said gettering layer being capable of attracting sodium ions and being diffusible into the layer of amorphous silicate material;

whereby the sodium ions are driven toward the upper surface of the layer of amorphous silicate material that includes the gettering layer by the combined action of said field and said gettering layer;

said upper portion of the layer of amorphous silicate material having the sodium ions therein and said gettering layer being removed by said RF sputtering.

9. The method according to claim 8 including:

forming a thin metallic film on the upper surface of said gettering layer;

heating the substrate;

and supplying a positive bias to the metallic film of sufficient magnitude for a sufficient period of time to cause the upper surface of the gettering layer to be negatively charged with respect to the lower surface of the layer of amorphous silicate material to aid in attracting the sodium ions to the gettering layer;

said thin metallic film, said gettering layer and said upper portion of the layer of amorphous silicate material having the sodium ions therein being removed by said RF sputtering.

References Cited

UNITED STATES PATENTS

| | | | |
|---|---|---|---|
| 3,419,761 | 12/1968 | Pennebaker | 204—192 |
| 3,479,269 | 11/1969 | Byrnes et al. | 204—192 |
| 3,529,347 | 9/1970 | Ingless et al. | 29—576 X |
| 3,507,709 | 4/1970 | Bower | 29—576 X |
| 3,470,609 | 10/1969 | Breitweiser | 29—576 X |
| 3,446,659 | 5/1969 | Wisman et al. | 317—235.46 |
| 3,445,280 | 5/1969 | Tokuyama et al. | 117—201 X |
| 3,438,121 | 4/1969 | Wanlass et al. | 29—578 |

JOHN H. MACK, Primary Examiner

D. R. VALENTINE, Assistant Examiner

PO-1050
(5/69)

UNITED STATES PATENT OFFICE
CERTIFICATE OF CORRECTION

Patent No. 3,783,119 Dated January 1, 1974

Inventor(s) Lawrence V. Gregor & Leon I. Maissel

It is certified that error appears in the above-identified patent and that said Letters Patent are hereby corrected as shown below:

Column 1, line 14 "$(P_2O)$" should be --$(P_2O_5)$--

Column 6, line 22-23 "sputter-chamber" should be --sputtering chamber--

Signed and sealed this 12th day of November 1974.

(SEAL)
Attest:

McCOY M. GIBSON JR.
Attesting Officer

C. MARSHALL DANN
Commissioner of Patents